US007208369B2

(12) United States Patent
Pai et al.

(10) Patent No.: US 7,208,369 B2
(45) Date of Patent: Apr. 24, 2007

(54) DUAL POLY LAYER AND METHOD OF MANUFACTURE

(75) Inventors: Chih-Yang Pai, Hsinchu (TW); Min-Hsiung Chiang, Taipei (TW); Chen-Jong Wang, Hsin Chu (TW); Shou-Gwo Wuu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/662,609

(22) Filed: Sep. 15, 2003

(65) Prior Publication Data

US 2005/0056885 A1 Mar. 17, 2005

(51) Int. Cl.
*H01L 21/8242* (2006.01)
(52) U.S. Cl. .................. 438/241; 438/275; 438/238; 438/210; 438/258; 257/903; 257/904; 257/E21.661; 257/E27.098
(58) Field of Classification Search ........ 438/655–657, 438/621, 238, 586, 253, 285, 152, 594, 734, 438/647; 257/382, 532, 755, 763, E21.507, 257/E21.593, E21.66, 903, 385
See application file for complete search history.

(56) References Cited

U.S. PATENT DOCUMENTS

| | | | | |
|---|---|---|---|---|
| 5,317,178 A | * | 5/1994 | Wu ........................... 257/314 |
| 5,668,035 A | * | 9/1997 | Fang et al. ................. 438/239 |
| 5,674,770 A | * | 10/1997 | Lee et al. ................... 438/152 |
| 5,903,035 A | * | 5/1999 | Wu et al. ................... 257/381 |
| 6,022,794 A | * | 2/2000 | Hsu ............................ 438/526 |
| 6,150,267 A | * | 11/2000 | Chen .......................... 438/683 |
| 6,271,073 B1 | * | 8/2001 | Roberts ...................... 438/238 |
| 6,365,469 B2 | * | 4/2002 | Chittipeddi et al. ........ 438/299 |
| 6,380,024 B1 | * | 4/2002 | Liaw .......................... 438/238 |
| 6,380,598 B1 | * | 4/2002 | Chan .......................... 257/390 |
| 6,458,655 B1 | * | 10/2002 | Yuzuriha et al. ............ 438/257 |
| 6,677,650 B2 | * | 1/2004 | Fischer et al. .............. 257/382 |
| 6,815,755 B2 | * | 11/2004 | Colclaser et al. ........... 257/314 |

* cited by examiner

*Primary Examiner*—Thao X. Le
(74) *Attorney, Agent, or Firm*—Slater & Matsil, L.L.P.

(57) ABSTRACT

Semiconductor devices having a dual polysilicon electrode and a method of manufacturing are provided. The semiconductor devices include a first polysilicon layer deposited on a second polysilicon layer. Each polysilicon layer may be doped individually. The method also allows for some semiconductor devices on a wafer to have a single polysilicon wafer and other devices to have a dual polysilicon layer. In one embodiment, the semiconductor devices are utilized to form a memory device wherein the storage capacitors and transistors located in the cell region are formed with a dual polysilicon layer and devices in the periphery region are formed with a single polysilicon layer.

10 Claims, 8 Drawing Sheets

DUAL POLY LAYER AND METHOD OF MANUFACTURE

TECHNICAL FIELD

The present invention relates to the field of semiconductor devices, and more specifically, to a dual poly layer structure and method of manufacturing.

BACKGROUND

Semiconductor memory devices are used in a wide variety of contexts. One type of memory is a static random access memory (SRAM). This type of memory is considered static because it will retain its state without need for refresh. A system that utilizes an SRAM will typically have dedicated SRAM memory chips or will include the memory on-chip with other circuitry, e.g., embedded memory. The present invention is applicable in either case.

Figure 1:
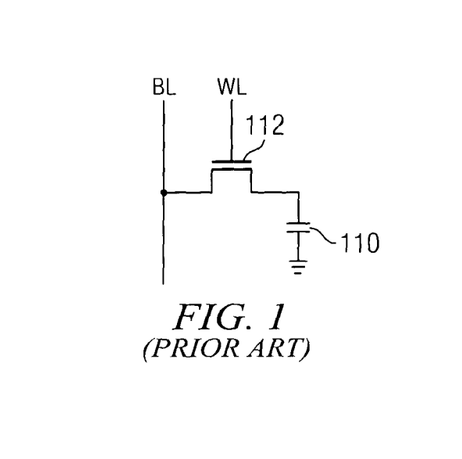
FIG. 1 is a circuit diagram illustrating a memory cell of the prior art.

FIG. 1 is a circuit diagram of one type of SRAM memory cell, namely, a one-transistor SRAM (1T-SRAM). Generally, the memory cell of a 1T-SRAM includes a bit line BL, a word line WL, a capacitor 110, and a transistor 112. The word line WL is connected to the gate of the transistor 112. The source and drain of the transistor 112 is electrically coupled to the capacitor 110 and the bit line BL. The bottom plate of the capacitor 112 is generally electrically coupled to ground.

In operation, the capacitor 110 stores a charge representing a logic "0" or a logic "1." The capacitor 110 is written to or read from by activating the word line WL, thereby allowing a charge to flow from the capacitor 110 to the bit line BL during a read cycle and allowing a charge to flow from the bit line to the capacitor 110 during a write cycle. During the read cycle, the value read via the bit line BL is generally conducted to a sense amp (not shown) wherein the signal is amplified and conducted to other circuitry (not shown).

Figure 2:
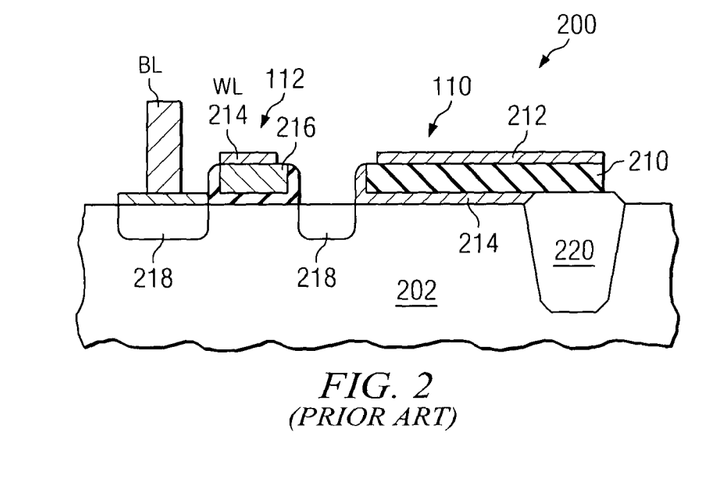
FIG. 2 is a cross-section view of a semiconductor wafer illustrating the fabrication of the memory cell illustrated in FIG. 1.

FIG. 2 is a cross section of a metal oxide semiconductor (MOS) circuit 200 implementing the circuit illustrated in FIG. 1. The circuit 200 is formed on a substrate 202, which is generally a silicon or glass substrate. The capacitor 110 has a dielectric layer 210 placed between a top electrode 212 and a bottom electrode 214. The dielectric layer 210 is typically silicon dioxide or some other oxide, and the top electrode 212 is typically a conductive metal or a doped polysilicon. The bottom electrode 214 is typically a conductive metal, a doped polysilicon, or doped area of the substrate. The transistor 112 typically has a gate electrode 214 and a gate oxide 216. The transistor 112 has its source and drain coupled to the capacitor 110 and the bitline BL via doped areas 218 of the substrate. A shallow-trench isolation (STI) structure 220 may be used to isolate the memory cell from other circuitry. The memory cell may be constructed as either a p-channel MOS (PMOS) or an n-channel MOS (NMOS) structure.

During fabrication, periphery devices, such as transistors, are also located on the same chip or die as the memory cell discussed above. The top plate 212 of the capacitor 110 is typically formed of a doped polysilicon material and is formed in the same process step as the gates for transistors, which also utilize a doped polysilicon material. Furthermore, the dielectric layer 210 is typically formed in the same process step as the transistor gate oxide in the periphery and core regions.

Fabricating the top plate 212 and the dielectric layer 210 of the capacitor 110 in the same process step as the transistor gate oxide 216 and gate electrode 214, however, requires that the doped concentration and thickness of the top plate 212 and the transistor gate electrode 214 be substantially equivalent. Utilizing the same dopant concentration for electrodes 212 and 214 and the same thickness for dielectric layers 210 and 216 may cause capacitance leakage and/or low capacitance. In other words, increasing the oxide thickness to reduce capacitor leakage impacts the logic gate oxide performance, and decreasing the oxide thickness to gain higher capacitance also impacts the logic gate oxide performance.

Therefore, there is a need for a method of fabricating memory devices to reduce capacitance leakage or increase capacitance.

SUMMARY OF THE INVENTION

These and other problems are generally reduced, solved or circumvented, and technical advantages are generally achieved, by embodiments of the present invention which provides a dual poly layer and a method of manufacturing same.

In one embodiment of the present invention, a semiconductor device is provided having two polysilicon layers, a first layer on a second layer. By depositing two or more layers of polysilicon, each layer may be doped independently to allow precise control of the doping process. Furthermore, the dielectric layers 210 and 216 may be grown independently to allow different thickness needs for transistor and capacitor.

In another embodiment of the present invention, the semiconductor device is a memory device. The dual layer polysilicon structure is particularly useful in creating a dual polysilicon capacitor electrode, which may allow for greater capacitance. Furthermore, semiconductor device may include multiple regions, such as a cell region and a periphery region. Each region may have different layering of polysilicon.

In yet another embodiment of the present invention, a method of forming a semiconductor is provided. The method provides for forming on a substrate a first doped polysilicon layer. A second doped polysilicon layer is then formed on the first doped polysilicon layer.

In yet another embodiment of the present invention, a method of forming a semiconductor, such as a memory device, with dual polysilicon layers is provided. The method provides a cell region with a cell gate oxide and a periphery region with a logic gate oxide. A first layer of polysilicon is formed on the cell gate oxide. A second layer of polysilicon is formed on the logic gate oxide and the first layer of polysilicon. Thus, one layer of polysilicon is formed in the periphery region, and two layers of polysilicon are formed in the cell region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that embodiments of the present invention provide many applicable inventive concepts that can be embodied in a wide variety of specific contexts. The specific embodiments discussed are merely illustrative of specific ways to make and use the invention, and do not limit the scope of the invention.

For example, one embodiment of the present invention is a dual polysilicon layer utilized to fabricate a capacitor electrode. The discussions that follow describe a process of forming a dual-layer capacitor electrode in the context of a memory cell such as a 1T-SRAM memory cell, which is one embodiment in which the present invention is particularly useful due to the process and performance advantages. The dual polysilicon layers may, however, be utilized to fabricate other memory devices (e.g., DRAM, EEPROM, FRAM, RAM, ROM, or the like) and other semiconductor devices (e.g., transistors, and the like). Furthermore, the present invention may be utilized to fabricate other types of SRAM memory cells, such as 5T-SRAM, 6T-SRAM, and the like.

Figure 3A:
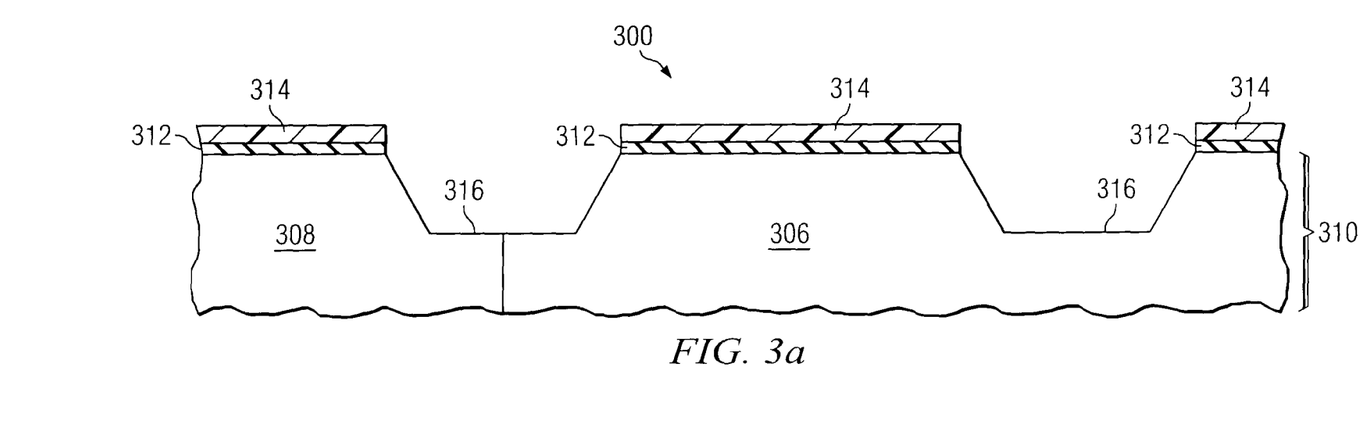
FIGS. 3a–3n are cross-section views of various stages of fabricating a memory cell in accordance with one embodiment of the present invention.
Figure 3B:
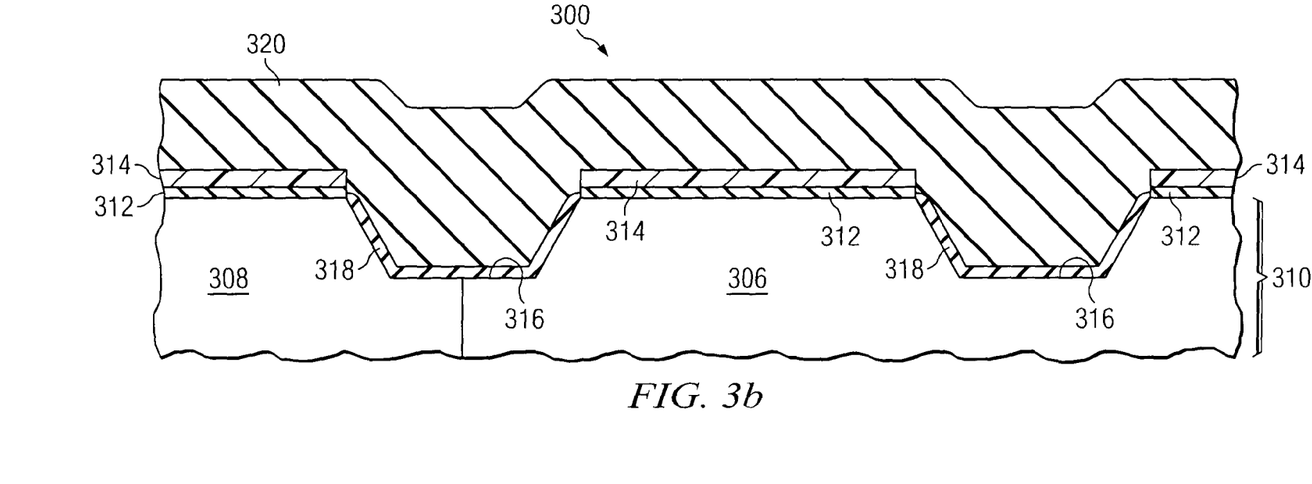
Figure 3C:
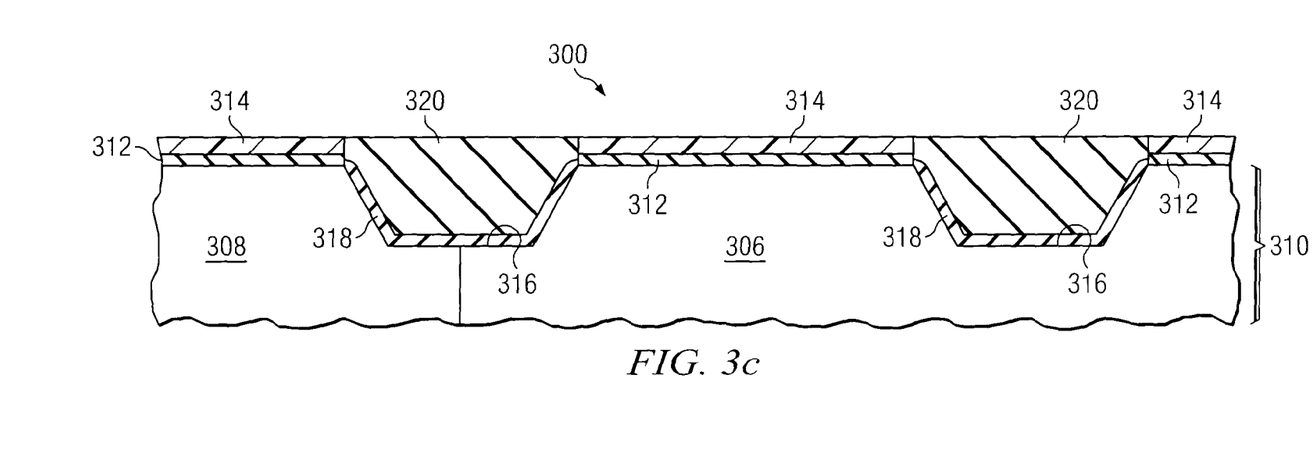
Figure 3D:
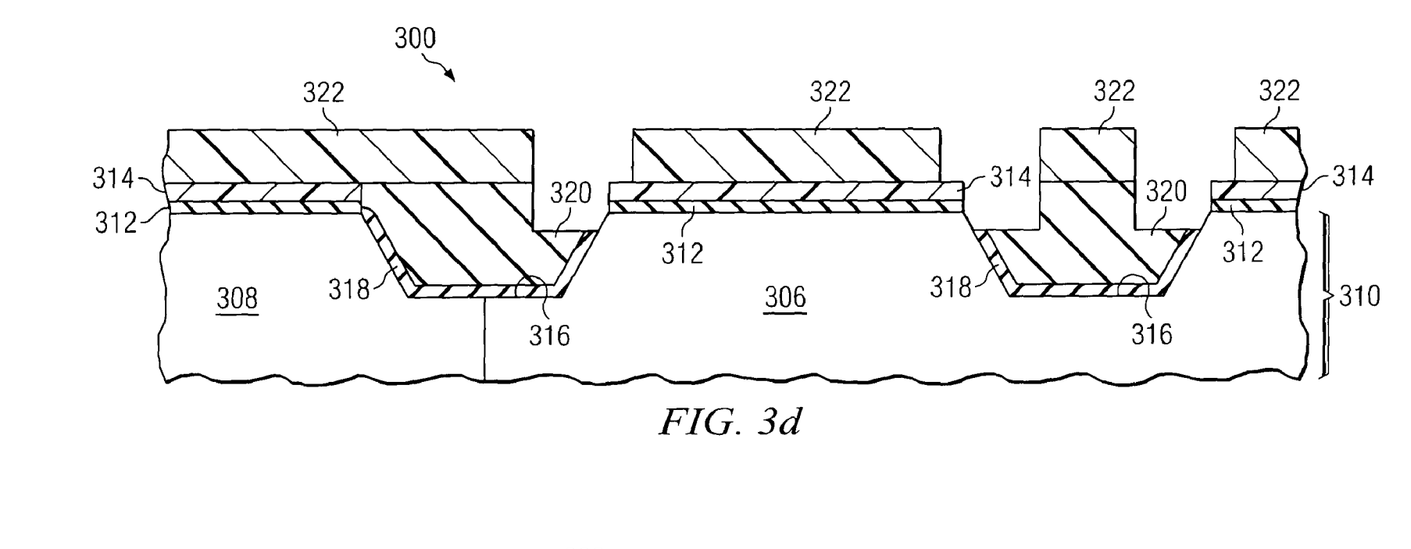
Figure 3E:
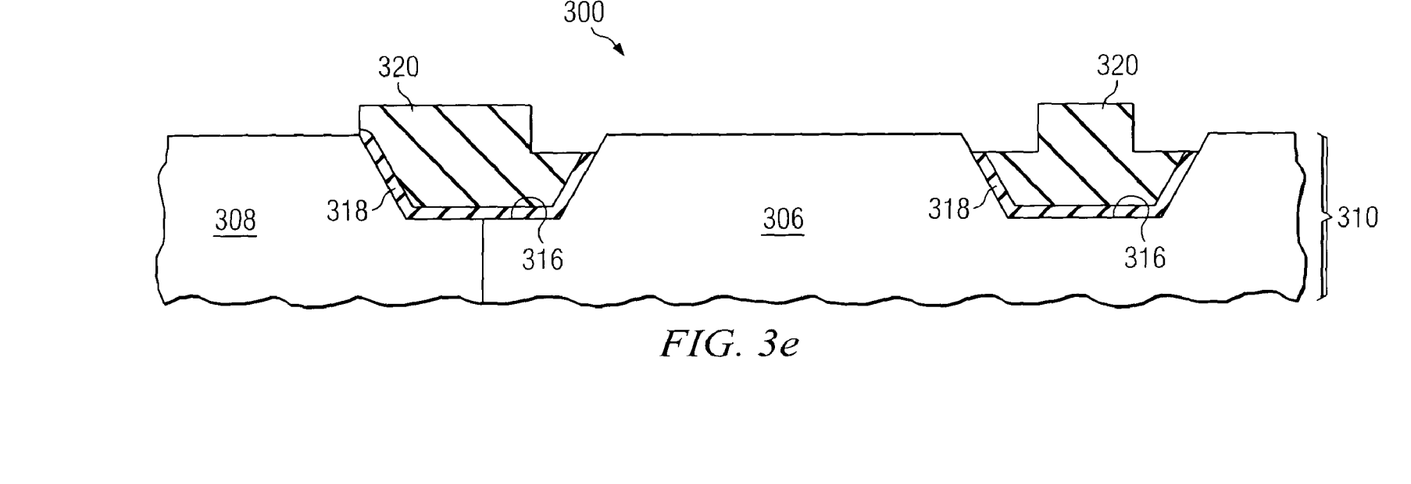
Figure 3F:
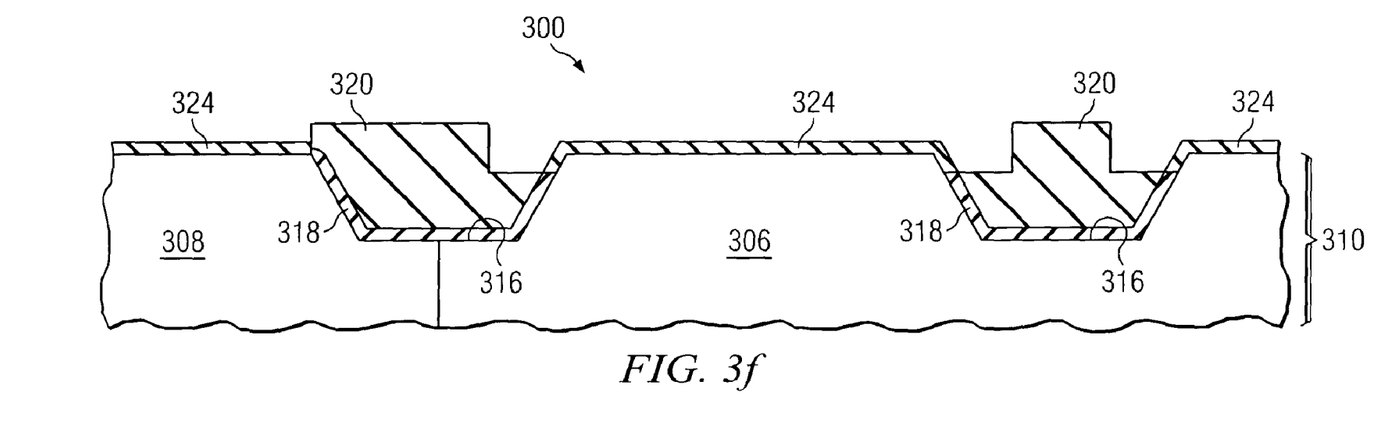
Figure 3G:
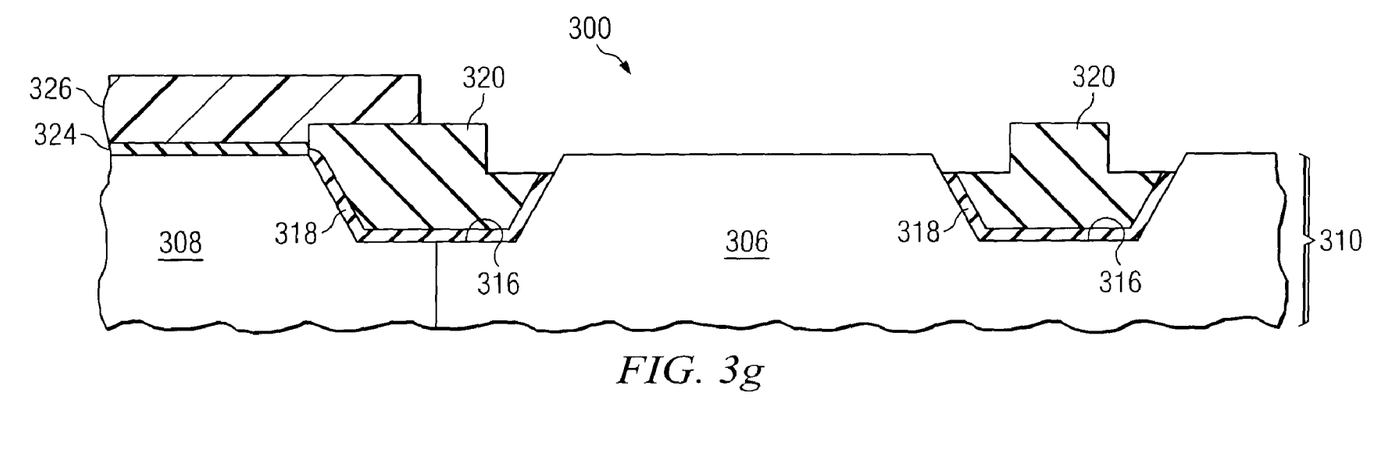
Figure 3H:
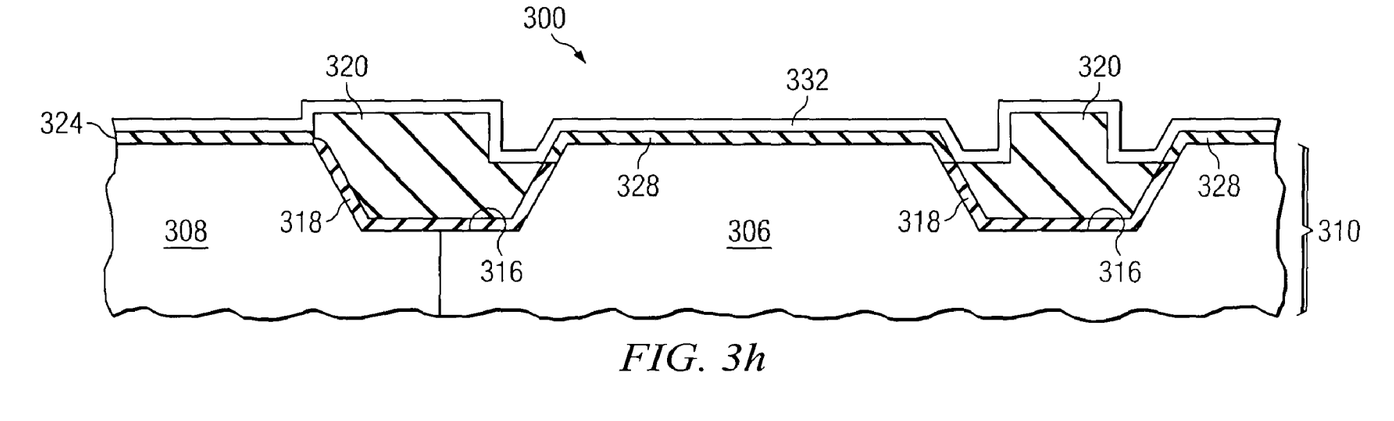
Figure 3I:
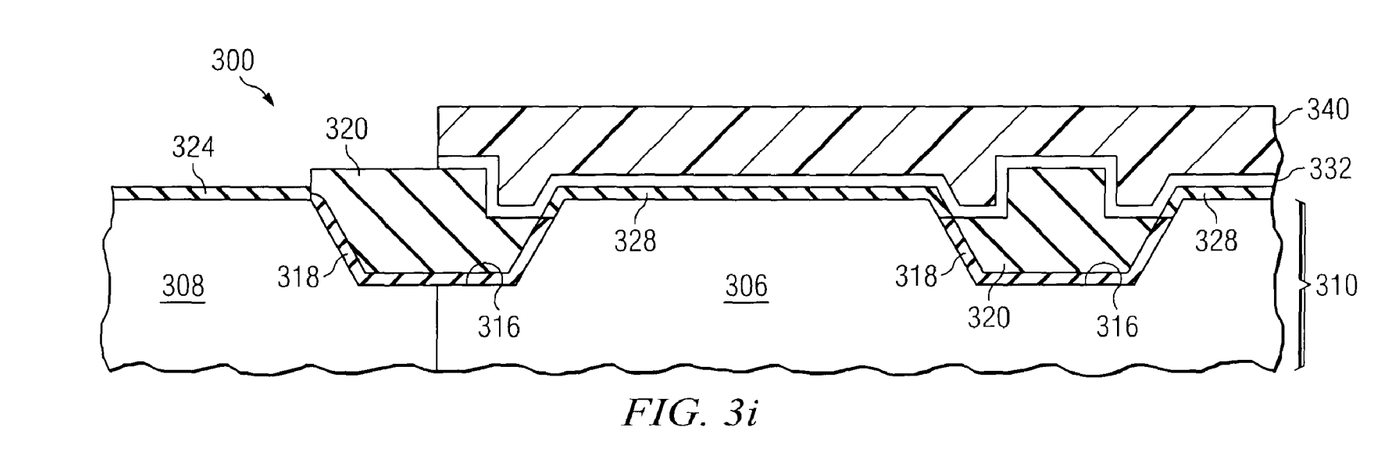
Figure 3J:
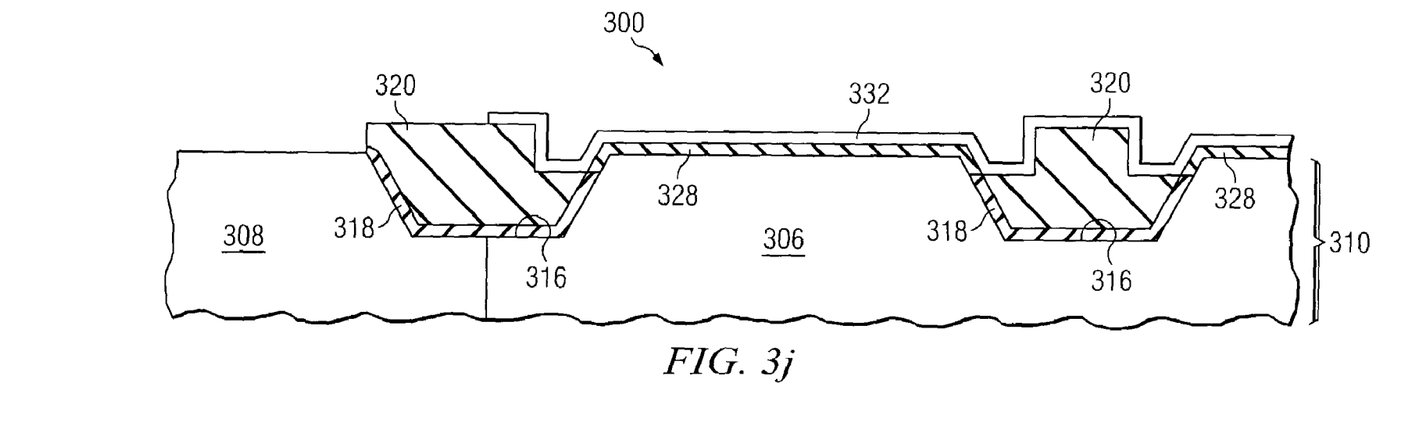
Figure 3K:
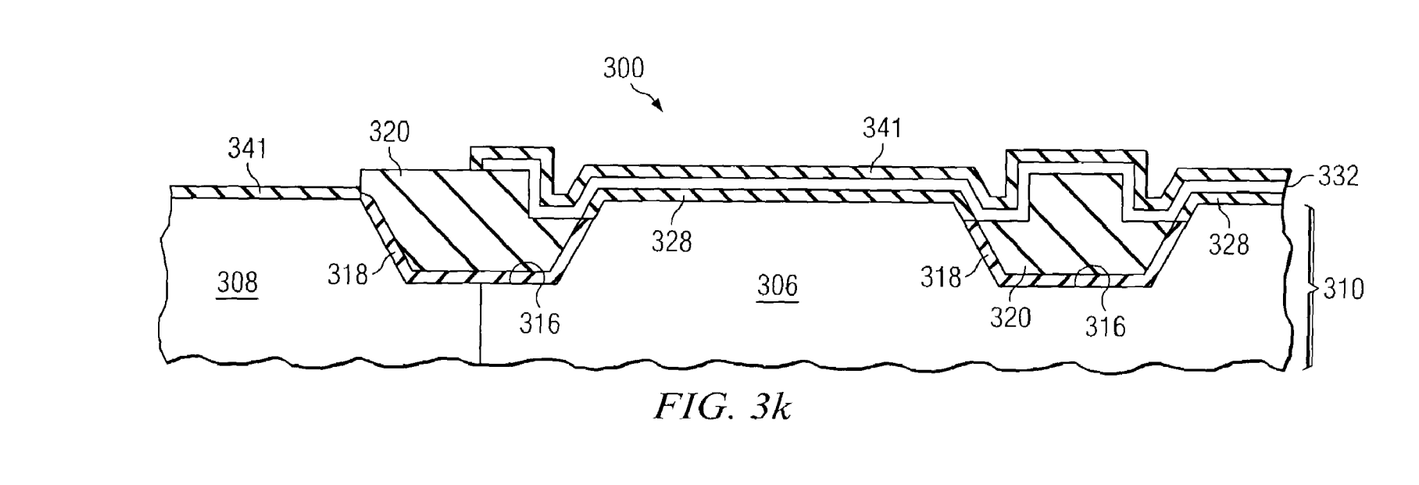
Figure 3L:
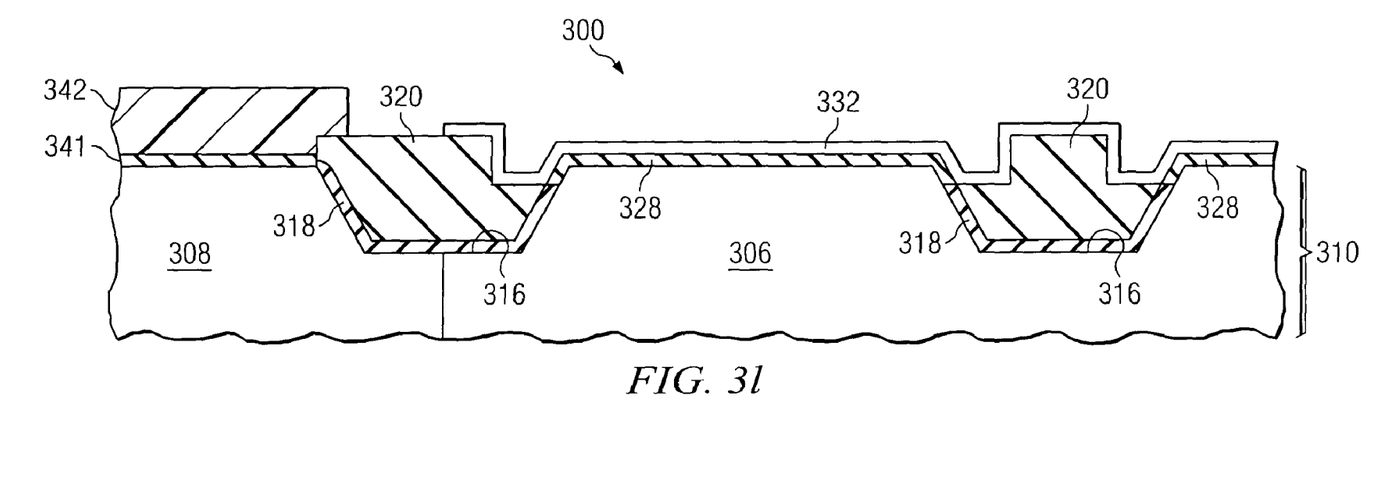
Figure 3M:
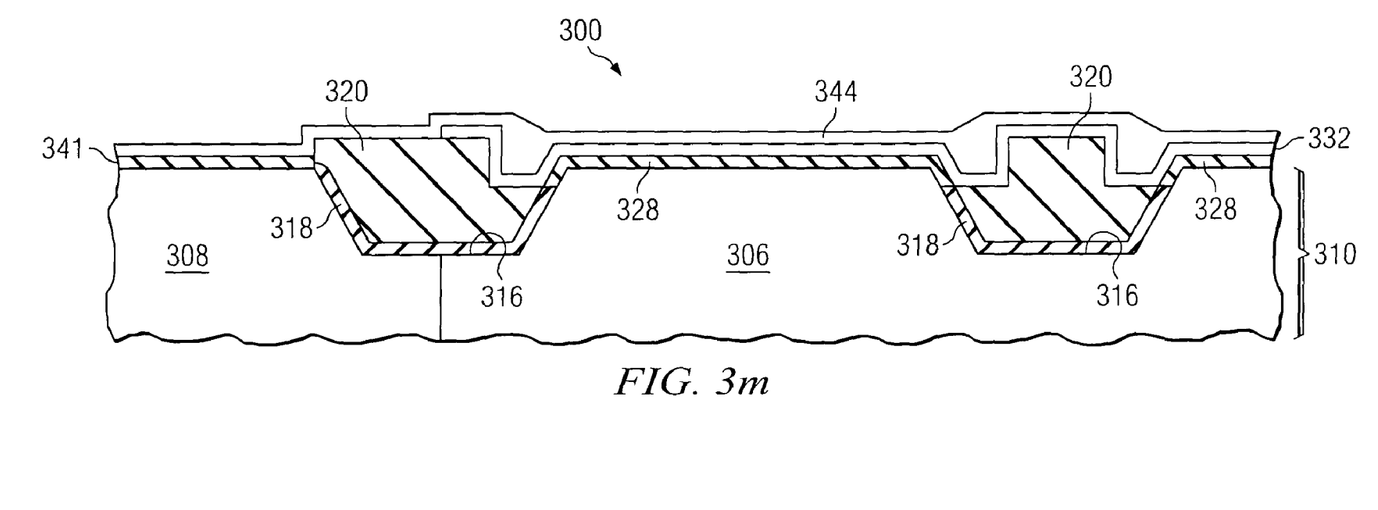
Figure 3N:
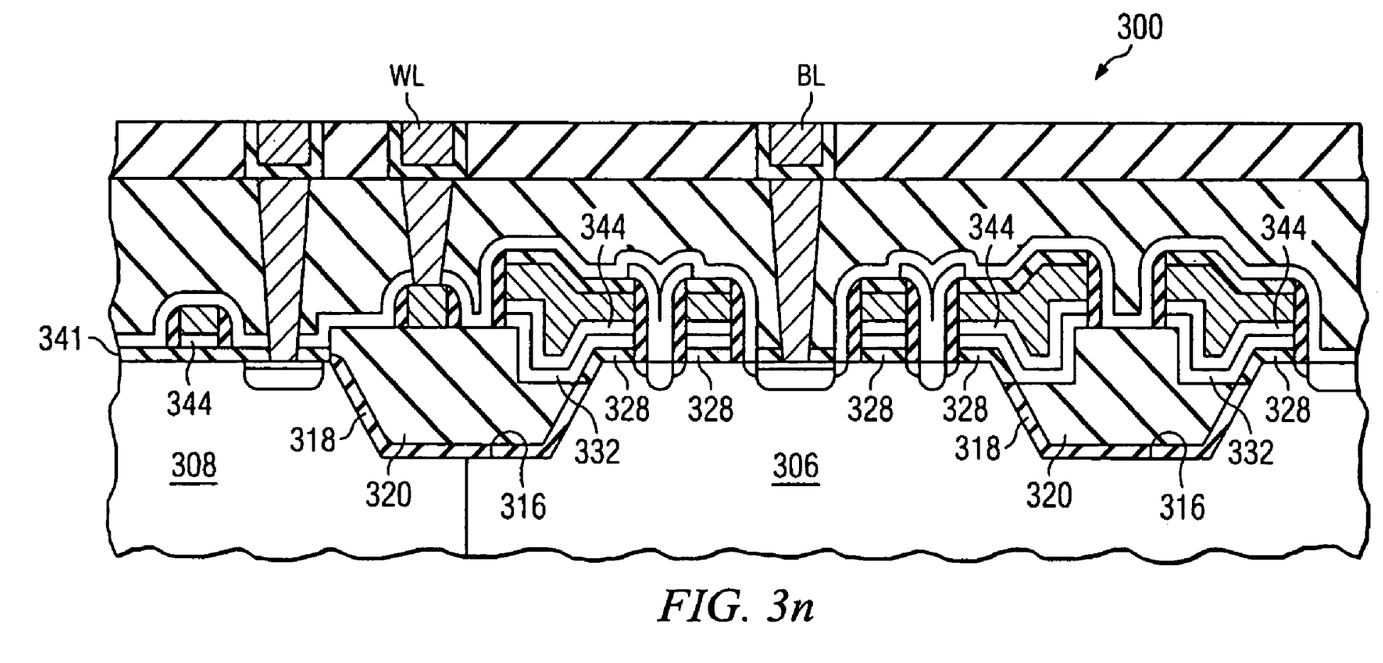

FIGS. 3a–3n illustrate cross-section views of a wafer during various steps of one embodiment of the present invention in which a dual-electrode capacitor is fabricated for use in a 1T-SRAM memory cell. For purposes of illustration, FIGS. 3a–3n illustrate a portion of a cell region 306 and a portion of a periphery region 308. The cell region 306 may include, for example, a memory cell having storage capacitors and transistors required to access the storage capacitors. The periphery region 308 may include sense amplifiers, transistors, capacitors, and other logic circuits that control the reading to and writing from the memory cell.

The process begins in FIG. 3a, wherein a wafer 300 has been prepared by forming on a substrate 310 a pad oxide layer 312 and a hard mask 314, and shallow trench isolations (STI) 316 formed thereon. The pad oxide layer 312 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. In the preferred embodiment, however, the pad oxide layer 312 is silicon dioxide material formed by a wet or dry oxidation process, such as a furnace oxidation in an ambient environment Of $O_2$, $H_2O$, a combination thereof, or the like, or an in-situ steam generation (IS SG) process in an ambient environment Of $O_2$, $H_2O$, NO, a combination thereof, or the like. In the preferred embodiment, the pad oxide layer is about 50 Å to about 300 Å in thickness, but most preferably about 90 Å to about 150 Å in thickness.

The hard mask 314 preferably comprises one or more layers of an oxide, a nitride, $Si_3N_4$, SiON, high-K dielectric (preferably greater than 5), a combination thereof, or the like. In the preferred embodiment, the hard mask layer 314 is a silicon nitride ($Si_3N_4$) layer formed on top of the pad oxide layer 312. The $Si_3N_4$ layer may be formed using CVD techniques using silane and ammonia as precursor gases. Preferably, the hard mask 314 is approximately 500 Å to 3000 Å in thickness, but most preferably about 1000 Å to about 2000 Å in thickness.

The pad oxide layer 312 and the hard mask 314 are patterned and etched to form the STIs 316. Preferably, the pad oxide layer 312 and the hard mask 314 are patterned by depositing, exposing, and developing a photoresist material (not shown), as is known in the art. After the pad oxide layer 312 and the hard mask 314 are patterned, the wafer 300 is etched to form the STIs 316. The etching process may be a wet or dry, anisotropic or isotropic, etch process, but preferably is an anisotropic dry etch process. The depth of the isolation trenches 316 is preferably about 2000 to 6000 Å, but may be more or less as desired for a particular application.

FIG. 3b is a cross-section view of wafer 300 illustrated in FIG. 3a after an oxide liner 318 and an oxide layer 320 has been formed. The oxide liner 318 provides an adhesion barrier layer for the oxide layer 320 and may be formed by any suitable oxidation process known in the art. In the preferred embodiment, however, the oxide liner 318 is formed by an oxidation process described above in reference to the pad oxide layer 312 and is about 50 Å to 300 Å in thickness, but most preferably about 70 Å to about 200 Å in thickness.

The oxide layer 320 provides an insulating fill material in the STIs located between devices formed on the wafer 300 to prevent interference between devices. Preferably, the oxide layer 320 is a high-density plasma (HDP) oxide formed by conventional methods. In the preferred embodiment, the pad oxide layer is about 4000 Å to about 10000 Å in thickness, but most preferably about 6000 Å to about 8000 Å in thickness.

FIG. 3c is a cross-section view of wafer 300 illustrated in FIG. 3b after the wafer has been planarized. The preferred method of planarizing the wafer 300 is by chemical-mechanical polishing (CMP) using a oxide slurry wherein the hard mask 314 is a stop layer.

FIG. 3d is a cross-section view of wafer 300 illustrated in FIG. 3c after a photoresist mask 322 has been formed, patterned, and developed, and the resulting wafer etched. The photoresist mask 322 defines the shape of the features that are to be formed in the succeeding etching process. The photoresist mask 322 along with the hard mask 314 and pad oxide layer 312 protect the underlying material during the etching process. In the scenario illustrated in FIG. 3d, the photoresist mask 322 defines the insulating shape of the oxide layer 320.

FIG. 3e is a cross-section view of wafer 300 illustrated in FIG. 3d after the photoresist mask 322, the pad oxide layer 312, and hard mask 314 have been removed. A plasma ashing process may be used to remove the photoresist mask 322. One preferred plasma ashing process uses an $O_2$ flow rate of about 1000 sccm to about 2000 sccm at a pressure of about 300 mTorr to about 600 mTorr and at power of about 500 Watts to about 2000 Watts and at a temperature of about 80° C. to about 200° C., for example. The plasma ashing process may be followed by a wet dip in a sulfuric acid ($H_2SO_4$) solution to clean the wafer and remove remaining photoresist material.

The hard mask 314 may be removed, for example, by using a wet dip in phosphoric acid solution of phosphoric acid ($H_3PO_4$) and water ($H_2O$). The pad oxide layer 312 may be removed, for example, by using a wet dip in dilute hydrofluoric acid.

FIG. 3f is a cross-section view of wafer 300 illustrated in FIG. 3e after a sacrificial oxide layer 324 is formed on the exposed areas of the substrate 310. The sacrificial oxide layer 324 acts as an etch stop during the formation of the polysilicon structures discussed below. The sacrificial oxide layer 324 may be formed by any oxidation process, such as a wet or dry oxidation process. The oxidation methods discussed above with reference to the pad oxide layer 312 and oxide liner 318 are examples of methods that may be used to form the sacrificial oxide layer 324. Other methods, however, may also be used.

FIG. 3g is a cross-section view of wafer 300 illustrated in FIG. 3f after a photoresist mask layer 326 is deposited, patterned, developed, and etched. The photoresist mask layer 326 restricts the formation of an oxide layer to the cell array region 306 during subsequent processing steps.

FIG. 3h is a cross-section view of wafer 300 illustrated in FIG. 3g after a cell gate oxide layer 328 has been formed in the cell region 306, the photoresist mask layer 326 has been removed, and a poly layer 332 has been formed. The cell gate oxide layer 328 is preferably formed of a dielectric material and may be etched in subsequent steps to form the dielectric material of storage capacitors and the gate oxide of transistors. In the preferred embodiment, the cell gate oxide layer 328 is a layer of silicon dioxide formed by any oxidation process, such as a wet or dry oxidation process. The cell gate oxide layer is preferably about 20 Å to about 50 Å in thickness, but most preferably about 22 Å to about 35 Å in thickness.

The photoresist mask layer 326 may, for example, be removed by a plasma etching process, and preferably, followed by a wet dip in a sulfuric acid solution to clean the wafer and remove the remaining photoresist as described above with reference to FIG. 3e.

The polysilicon layer 332, as will be discussed in greater detail below, will form one of the dual polysilicon layers of the capacitor and transistor in the cell region 306. In the preferred embodiment in which the memory cell is a PMOS memory cell, the polysilicon is a p-type doped polysilicon. The polysilicon may be deposited, for example, by a low-pressure chemical vapor deposition (LPCVD) furnace deposition process of an in-situ doped polysilicon. The LPCVD furnace deposition process may, for example, use an ambient comprising silane and $BCl_3$ with an ion concentration of about $1.0E20$ atoms/cm$^3$ and a temperature of temperature of about 540° C. and 640° C. The polysilicon layer 332 is preferably about 200 Å to about 3000 Å in thickness, but most preferably about 500 Å to about 1000 Å in thickness.

The polysilicon may also be deposited undoped by an LPCVD process with a silane ambient. Once applied, the polysilicon can be doped with boron ions at a dose of about $1.0E15$ to about $1.0E16$ atoms/cm$^2$ and at an energy of about 20 to about 50 KeV. Alternatively, the polysilicon may be doped using aluminum, gallium, indium, or the like.

FIG. 3i is a cross-section view of wafer 300 illustrated in FIG. 3h after a mask layer 340 has been formed and patterned, and the polysilicon layer 332 has been etched. In the preferred embodiment, the mask layer 340 is a photoresist mask layer that has been deposited, patterned, and developed to expose underlying regions of the polysilicon layer 332. After patterning, an etching process is performed by, for example, a wet or dry, anisotropic or isotropic, etch process, but preferably is an anisotropic dry etch process. The sacrificial oxide layer 324 acts as an etch stop in the periphery region 308 during the etching process. FIG. 3j illustrates the wafer 300 after the mask layer 340 and the sacrificial layer 324 has been removed.

FIG. 3k is a cross-section view of wafer 300 illustrated in FIG. 3j after a logic gate oxide layer 341 has been formed on the polysilicon layer 332 and the exposed areas of the substrate 310. The logic gate oxide layer 341 may form, for example, the gate oxide layer of the transistors and may act as a dielectric layer in other devices in the periphery region 308 of the memory device. The logic gate oxide layer 341 may be formed by, for example, a wet or dry oxidation process. The logic gate oxide layer 341 is preferably about 15 Å to about 60 Å in thickness, but most preferably about 18 Å to about 35 Å in thickness.

FIG. 3l is a cross-section view of wafer 300 illustrated in FIG. 3k after a mask layer 342 has been formed, patterned, and etched to protect the logic gate oxide layer 341 in the periphery region 308 and after the logic gate oxide layer 341 on the polysilicon layer 332 has been removed from the cell region 306. As one of ordinary skill in the art will appreciate, these steps remove the logic gate oxide layer in the cell region 306 such that a second polysilicon layer may be deposited on the polysilicon layer 332 in a later step. The logic gate oxide layer 341 remains in the periphery region 308 to be used to form semiconductor devices such as transistors on capacitors. In the preferred embodiment, the mask layer 342 is a photoresist mask layer that has been deposited, patterned, and developed to expose underlying regions of the logic gate oxide layer 341 located in the cell region 306. After patterning, the logic gate oxide layer 341 on the polysilicon layer 332 in the cell region may be removed by, for example, a wet dip in an HF solution as described above.

FIG. 3m is a cross-section view of wafer 300 illustrated in FIG. 3l after a polysilicon layer 344 has been formed. The polysilicon layer 344 forms the gate poly for devices in the periphery region 308 and the second poly layer for devices in the cell region 306. In the preferred embodiment, the devices in the periphery region 308 may be NMOS devices, PMOS devices, or a combination thereof, and devices in the cell region 306 are PMOS devices. Accordingly, it is preferred that the polysilicon layer 344 be applied undoped and doped by ion implantation. Masks may be used to restrict the ion implantation to specific areas. Furthermore, while invention has been described in the context of creating PMOS devices in the cell region 306, similar processes may be used to form NMOS devices in the cell region 306.

For memory devices utilizing PMOS structures in the cell region 306, the polysilicon layer 344 located in the cell region 306 may be deposited, for example, by LPCVD to a thickness in the range of about 500 Å to about 5000 Å in thickness, but most preferably about 1000 Å to about 3000 Å in thickness. Once applied, the polysilicon can be doped with phosphorous ions at a dose of about $1.0E15$ to about $1.0E16$ atoms/cm$^2$ and at an energy of about 20 to about 50 KeV. Alternatively, the polysilicon may be doped using nitrogen, arsenic, antimony, or the like.

As one of ordinary skill in the art will appreciate, the process described above fabricates devices utilizing dual polysilicon layers and a single polysilicon layer on the same die. In particular, devices within the cell region 306 utilize dual polysilicon layers (i.e., polysilicon layers 332 and 344), and devices within the periphery region 308 utilize a single polysilicon layer (i.e., polysilicon layer 344). Other configurations may be fabricated.

FIG. 3n is a cross-section view of wafer 300 illustrated in FIG. 3m after a memory cell has been fabricated in accordance with one embodiment of the present invention. The memory cell illustrated in FIG. 3n is provided for illustrative purposes only to illustrate one type of device that may be fabricated in accordance with one embodiment of the present invention and is preferably fabricated in accordance with commonly known fabrication techniques and processes. One skilled in the art will appreciate that many types of devices, including devices other than memory cells, may be fabricated in accordance with the present invention.

As one skilled in the art will appreciate, the method described above allows a different dopant concentration in the cell region 306 and the periphery region 308. A similar process may also be utilized to fabricate devices having differing amounts of dopant concentration and, thus, different electrical characteristics such as capacitance, conductivity, resistance, and the like. Furthermore, the process described above allows the thickness of the oxide layers to be varied without impacting the transistors.

Furthermore, the process described above may be repeated multiple times, thereby fabricating devices with three or more polysilicon layers. Each layer may have different dopant characteristics and different electrical characteristics. In this manner, devices may be designed and fabricated to more specifically suit their purpose.

Although particular embodiments of the invention have been described in detail, it is understood that the invention is not limited correspondingly in scope, but includes all changes, modifications, and equivalents coming within the spirit and terms of the claims appended hereto. For example, differing types of mask materials and photoresist materials may be used, negative photoresist may be used, other types of devices may be fabricated, other types of structures may be fabricated, and the like. Accordingly, it is understood that this invention may be extended to other structures and materials, and thus, the specification and figures are to be regarded in an illustrative rather than a restrictive sense.

What is claimed is:

1. A method of forming a semiconductor device, the method comprising:
   forming a cell gate oxide in a cell region;
   forming a logic gate oxide in a periphery region;
   forming a first doped polysilicon layer on the cell gate oxide; and
   forming a second polysilicon layer, the second polysilicon layer being in contact with the logic gate oxide in the periphery region and in contact with a major surface of the first doped polysilicon layer in the cell region;
   wherein the logic gate oxide and the second doped polysilicon layer form a first transistor and the cell gate oxide, the first doped polysilicon layer, and the second polysilicon layer form a second transistor.

2. The method of claim 1 wherein the second polysilicon layer positioned above the cell gate oxide is a p-type doped polysilicon.

3. The method of claim 2 wherein the second polysilicon layer is doped with a material selected from the group consisting essentially of phosphorous, nitrogen, arsenic, and antimony.

4. The method of claim 1 wherein the step of forming a first doped polysilicon layer is performed by depositing by furnace an in-situ doped polysilicon.

5. The method of claim 4 wherein depositing by furnace is performed at a temperature of about 540° C. to about 640° C.

6. The method of claim 1 wherein the second polysilicon layer is formed of undoped polysilicon.

7. The method of claim 1 further comprising the step of doping the second polysilicon layer located above the cell gate oxide with a p-type dopant.

8. The method of claim 7 further comprising the step of doping the second polysilicon layer located above the logic gate oxide with an n-type dopant.

9. The method of claim 7 further comprising the step of doping the second polysilicon layer located above the logic gate oxide with a p-type dopant.

10. The method of claim 7 wherein the p-type dopant is selected from the group consisting essentially of phosphorous, nitrogen, arsenic, and antimony.

* * * * *